United States Patent
Abdo

(10) Patent No.: US 10,804,874 B2
(45) Date of Patent: Oct. 13, 2020

(54) SUPERCONDUCTING COMBINER OR SEPARATOR OF DC-CURRENTS AND MICROWAVE SIGNALS

(71) Applicant: International Business Machines Corporation, Armonk, NY (US)

(72) Inventor: Baleegh Abdo, Fishkill, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 341 days.

(21) Appl. No.: 16/006,255

(22) Filed: Jun. 12, 2018

(65) Prior Publication Data

US 2020/0028480 A1    Jan. 23, 2020

(51) Int. Cl.
*H03H 7/46* (2006.01)
*G06N 10/00* (2019.01)

(52) U.S. Cl.
CPC .............. *H03H 7/46* (2013.01); *G06N 10/00* (2019.01)

(58) Field of Classification Search
CPC ...................................................... H03H 7/46
USPC ........................................................ 333/246
See application file for complete search history.

(56) References Cited

U.S. PATENT DOCUMENTS

| 5,244,869 | A  | 9/1993  | Billing   |
|-----------|----|---------|-----------|
| 6,657,324 | B1 | 12/2003 | Marumoto  |
| 7,417,516 | B2 | 8/2008  | Singh     |
| 8,350,642 | B2 | 1/2013  | Jensen    |
| 9,548,742 | B1 | 1/2017  | Abdo      |
| 9,735,776 | B1 | 8/2017  | Abdo et al. |
| 9,793,913 | B2 | 10/2017 | Bulzacchelli et al. |
| 9,793,933 | B1 | 10/2017 | Gupta et al. |
| 9,870,536 | B1 | 1/2018  | Abdo      |
| 9,941,908 | B2 | 4/2018  | Bauder    |
| 2010/0264948 | A1 | 10/2010 | Strid et al. |
| 2014/0340156 | A1 | 11/2014 | Kuroda    |
| 2017/0179999 | A1 | 6/2017  | Vassiliou et al. |
| 2018/0013426 | A1 | 1/2018  | Deurloo et al. |

(Continued)

FOREIGN PATENT DOCUMENTS

| JP | 2010-141787 A | 6/2010  |
|----|---------------|---------|
| WO | 94/28592 A1   | 12/1994 |

OTHER PUBLICATIONS

Denis, et al., "Fabrication of Superconducting Vacuum-Gap Crossovers for High Performance Microwave Applications," IEEE Transactions on Applied Superconductivity, vol. 27, No. 4, Jun. 2017, 4 pages.

(Continued)

*Primary Examiner* — Robert J Pascal
*Assistant Examiner* — Kimberly E Glenn
(74) *Attorney, Agent, or Firm* — Amin, Turocy & Watson, LLP

(57) ABSTRACT

Techniques that facilitate a superconducting combiner or separator of DC-currents and microwave signals are provided. In one example, a device includes a direct current circuit and a microwave circuit. The direct current circuit comprises a bandstop circuit and provides transmission of a direct current signal. The microwave circuit provides transmission of a microwave signal. The microwave circuit and the direct current circuit that comprises the bandstop circuit are joined by a common circuit that provides transmission of the direct current signal and the microwave signal.

25 Claims, 10 Drawing Sheets

(56) References Cited

U.S. PATENT DOCUMENTS

2018/0091244 A1    3/2018  Abdo et al.
2019/0044668 A1*   2/2019  Elsherbini .............. G06N 10/00

OTHER PUBLICATIONS

Vissers et al., "Low-noise kinetic inductance traveling-wave amplifier using three-wave mixing," Applied Physics Letters, 2016, vol. 108, No. 1, 012601,5 pages.

Rotzinger et al., "Aiuminium-oxide wires for superconducting high kinetic inductance circuits," arXiv:1408.4347v3 [cond-mat.supr-con], Jun. 15, 2016, 16 pages.

Erickson et al., "Frequency Comb Generation in Superconducting Resonators," Physical Review Letters, 2014, vol. 113, No. 18, 187002, 5 pages.

Niepce et al., "High Kinetic Inductance NbN Nanowire Superinductors," arXiv:1802.01723v1 [cond-mat.mes-hall], Feb. 5, 2018, 12 pages.

Maleeva et al., "Circuit Quantum Electrodynamics of Granular Aluminum Resonators," arXiv:1802.01859v2 [condmat.supr-con], Feb. 7, 2018, 17 pages.

International Search Report and Written Opinion received for PCT Application Serial No. PCT/EP2019/077247 dated Dec. 19, 2019, 20 pages.

Sungyun Jun et al: "Compact Square DC-Block Bandpass Filter With Slots", Progress in Electromagnetics Research Letters, vol. 38, Jan. 1, 2013 , pp. 17-23.

* cited by examiner

SUPERCONDUCTING COMBINER OR SEPARATOR OF DC-CURRENTS AND MICROWAVE SIGNALS

STATEMENT REGARDING FEDERALLY SPONSORED RESEARCH OR DEVELOPMENT

This invention was made with Government support under LOGIQ (LSLM) awarded by Defense Intelligence Agency (DIA). The Government has certain rights to this invention.

BACKGROUND

The subject disclosure relates to quantum hardware, and more specifically, to superconducting devices for quantum computing. A superconductor device can be a device that provides zero electrical resistance below a certain temperature. A superconducting device can be employed, for example, as a qubit for a quantum computer. Generally, a superconducting device employs inductances that are technology difficult to realize, occupy a large amount of space and/or introduce loss for signals. As such, it is desirable to reduce inductance of a superconducting device. In one example, Denis et al., "Fabrication of superconducting vacuum-gap crossovers for high performance microwave applications", discloses that "vacuum-gap crossovers were realized by using a sacrificial polymer layer followed by niobium sputter deposition optimized for coating coverage over an underlying niobium signal layer. Both coplanar waveguide and microstrip crossover topologies have been explored in detail. The resulting fabrication process is compatible with a bulk micromachining process for realizing waveguide coupled detectors, which includes sacrificial wax bonding, and wafer backside deep reactive ion etching for creation of leg isolated silicon membrane structures." (Abstract of Denis). However, superconducting devices can be improved.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices, systems, methods, apparatus and/or computer program products that facilitate a superconducting combiner or separator of DC-currents and microwave signals are described.

According to an embodiment, a device can comprise a direct current circuit and a microwave circuit. The direct current circuit can comprise a bandstop circuit. Furthermore, the direct current circuit can provide transmission of a direct current signal. The microwave circuit can provide transmission of a microwave signal. The microwave circuit and the direct current circuit that comprises the bandstop circuit can be joined by a common circuit that provides transmission of the direct current signal and the microwave signal. In an embodiment, the device can provide improved bandwidth for signals transmitted and/or received by the device. In certain embodiments, the bandstop circuit of the direct current circuit can block transmission of one or more microwave signals within a bandwidth of the device. In certain embodiments, the bandstop circuit of the direct current circuit can comprise a set of quarter-wavelength transmission lines. In certain embodiments, the microwave circuit can comprise a bandpass circuit. In an embodiment, the bandpass circuit of the microwave circuit can allow transmission of one or more microwave signals within a bandwidth of the device. In another embodiment, the bandpass circuit of the microwave circuit can comprise a set of quarter-wavelength transmission lines. In certain embodiments, the common circuit can combine the direct current signal received via a first port of the device and the microwave signal received via a second port of the device to generate a combined signal that is output via a third port of the device. In certain embodiments, the common circuit can separate a combined signal that is received via a first port of the device into the direct current signal via a second port of the device and the microwave signal via a third port of the device. In certain embodiments, the device can be a superconducting device. In certain embodiments, the microwave circuit and the direct current circuit can be joined by the common circuit to provide improved bandwidth for the microwave signal.

According to another embodiment, a device can comprise a direct current circuit and a microwave circuit. The direct current circuit can provide transmission of a direct current signal. The microwave circuit can comprise a bandpass circuit. Furthermore, the microwave circuit can provide transmission of a microwave signal. The microwave circuit that comprises the bandpass circuit and the direct current circuit can be joined by a common circuit that provides transmission of the direct current signal and the microwave signal. In an embodiment, the device can provide improved bandwidth for signals transmitted and/or received by the device. In certain embodiments, the bandpass circuit of the microwave circuit can allow transmission of one or more microwave signals within a bandwidth of the device. In certain embodiments, the bandpass circuit of the microwave circuit can comprise a set of lumped circuit elements. In certain embodiments, the bandpass circuit of the microwave circuit can comprise a set of inductors and a set of capacitors. In certain embodiments, the direct current circuit can comprise a bandstop circuit. In an embodiment, the bandstop circuit of the direct current circuit can block transmission of one or more microwave signals within a bandwidth of the device. In another embodiment, the bandstop circuit of the direct current circuit can comprise a set of quarter-wavelength transmission lines.

According to yet another embodiment, a device can comprise a direct current circuit and a microwave circuit. The direct current circuit can comprise a quarter-wavelength transmission line and a capacitor. Furthermore, the direct current circuit can provide transmission of a direct current signal. The microwave circuit can provide transmission of a microwave signal. Furthermore, the microwave circuit and the quarter-wavelength transmission line of the direct current circuit can be joined by a common circuit that provides transmission of the direct current signal and the microwave signal. In an embodiment, the device can provide improved bandwidth for signals transmitted and/or received by the device. In certain embodiments, the capacitor can be coupled between the quarter-wavelength transmission line and electrical ground. In certain embodiments, the capacitor can be a first capacitor. Furthermore, the microwave circuit can comprise a second capacitor electrically coupled to the quarter-wavelength transmission line and the common circuit.

According to yet another embodiment, a method is provided. The method can comprise receiving a direct current signal via first port of a device associated with a direct current circuit that comprises a bandstop circuit. The method can also comprise receiving a microwave signal via second port of the device associated with a microwave circuit that is joined to the direct current circuit by a common circuit that provides transmission of the direct current signal and the microwave signal. Additionally, the method can comprise combining the direct current signal received via the first port and the microwave signal received via the second port to generate a combined signal that is output via a third port of the device. In an embodiment, the method can provide improved bandwidth for signals transmitted by the device. In certain embodiments, the method can comprise blocking, via the bandstop circuit, transmission of one or more microwave signals within a bandwidth of the device. In certain embodiments, the method can comprise allowing, via a bandpass circuit of the microwave circuit, transmission of one or more microwave signals within a bandwidth of the device.

According to yet another embodiment, a method is provided. The method can comprise receiving a combined signal that comprises a direct current signal and a microwave signal via first port of a device associated with a common circuit that joins a microwave circuit and a direct current circuit that comprises a bandstop circuit. The method can also comprise outputting the direct current signal via a second port of the device associated with the direct current circuit that comprises the bandstop circuit. Additionally, the method can comprise outputting the microwave signal via a third port of the device associated with the microwave circuit. In an embodiment, the method can provide improved bandwidth for signals received by the device. In certain embodiments, the method can comprise blocking, via the bandstop circuit, transmission of one or more microwave signals within a bandwidth of the device. In certain embodiments, the method can comprise allowing, via a bandpass circuit of the microwave circuit, transmission of one or more microwave signals within a bandwidth of the device.

DETAILED DESCRIPTION

Figure 1:
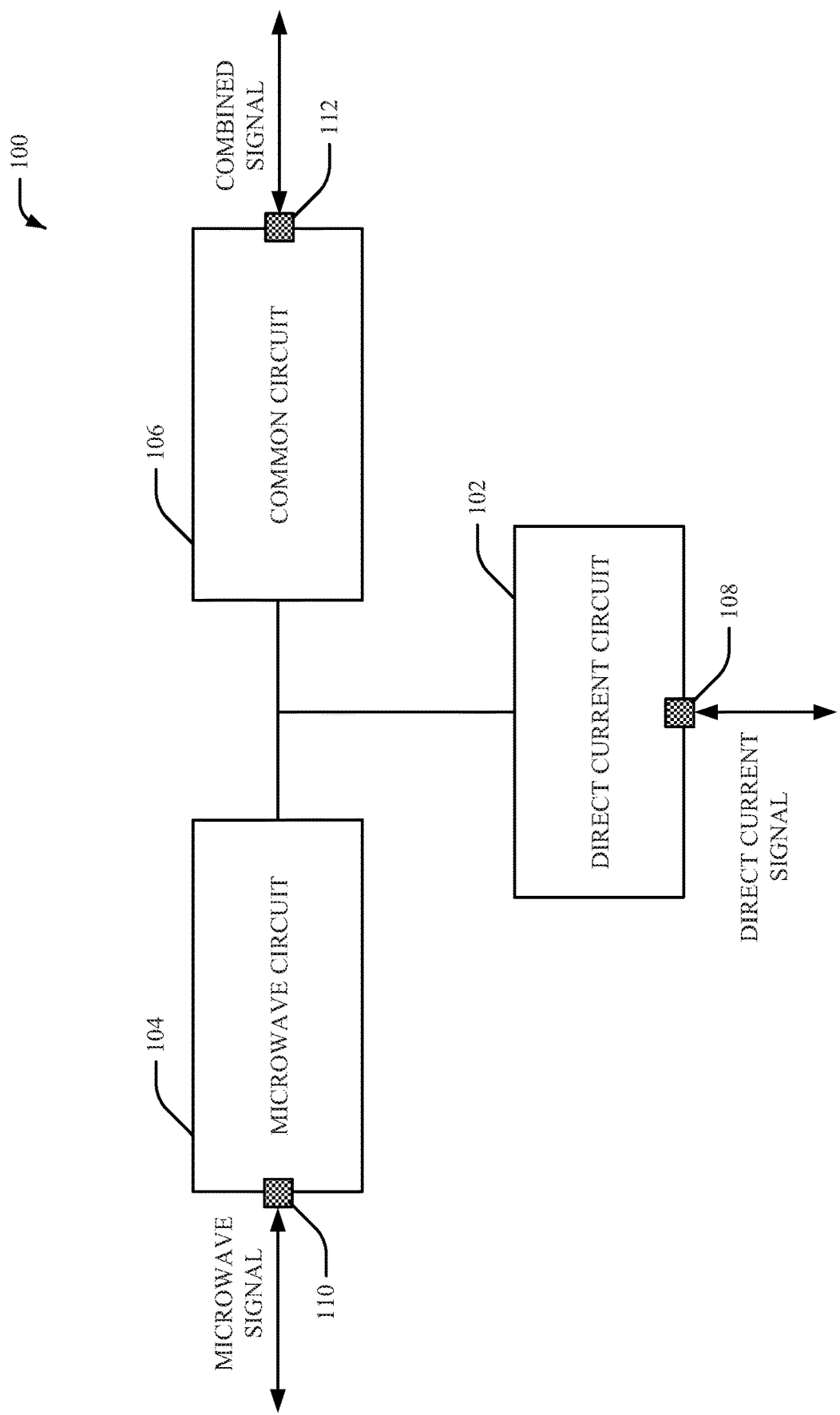
FIG. 1 illustrates an example, non-limiting system associated with a direct current circuit, a microwave circuit and a common circuit in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

A superconductor device can be a device that provides zero electrical resistance below a certain temperature. A superconducting device can be employed, for example, as a qubit for a quantum computer. Generally, a microwave device that combines/separates direct currents and microwave signals employs very large inductances that are technology difficult to realize, occupy a large amount of space and/or lossy. To realize such a microwave device using superconducting components, it is desirable to significantly reduce the inductance of the superconducting device and/or to improve one or more of its characteristics.

To address these and/or other issues, embodiments described herein include systems, methods, and computer program products that facilitate an improved superconducting device. For instance, an improved superconducting combiner of DC-currents and microwave signals can be provided. Additionally or alternatively, an improved superconducting combiner separator of DC-currents and microwave signals can be provided. In an embodiment, the superconducting device disclosed herein can be built on-chip. In another embodiment, the superconducting device can include multiple ports more combining and/or separating multiple signals. For instance, the superconducting device can include a first port that supports a direct current signal (e.g., a DC-port), a second port that supports a microwave signal (e.g., a microwave port), and a third port that supports both the microwave signal and direct current signal (e.g., a common port). In an aspect, the superconducting device can include a first circuit arm (e.g., a DC circuit arm) that supports direct current signals and a second circuit arm (e.g., a microwave circuit arm) that supports microwave circuits. The first circuit arm and the second circuit arm can be joined at a common node and arm that can support both the direct current signals and the microwave circuits. In an embodiment where a microwave signal is input to a microwave port, a direct current signal is input to a DC port, and a combined signal exits through a common port, the superconducting device can be implemented as a combiner. In another embodiment where a microwave signal and a direct current signal are input to a common port, the microwave signal exits through a microwave port, and the direct current signal exits through a DC port, the superconducting device can be implemented as a splitter. In one embodiment, the second circuit arm (e.g., the microwave circuit arm) can include a capacitor, and the first circuit arm (e.g., the DC circuit arm) can include a bandstop filter that supports direct current signals and blocks microwave signals within a bandwidth of the superconducting device. In another embodiment, the second circuit arm (e.g., the microwave circuit arm) can include a bandpass filter that allows transmission of microwave signals within a bandwidth of the superconducting device, and the first circuit arm (e.g., the DC circuit arm) can include a bandstop filter that supports direct current signals and blocks microwave signals within the bandwidth of the superconducting device. In yet another embodiment, the second circuit arm (e.g., the microwave circuit arm) can include a capacitor, the first circuit arm (e.g., the DC circuit arm) can include a quarter-wavelength transmission line that is shunted by a capacitor coupled to electrical ground, where the length of the transmission line can refer to a quarter of a wavelength associated with a center frequency of the superconducting device. In yet another embodiment, the second circuit arm (e.g., the microwave circuit arm) can include a capacitor, the first circuit arm (e.g., the DC circuit arm) can include a quarter-wavelength transmission line that is shunted by a capacitor to electrical ground, and another quarter-wavelength transmission line that is shunted by another capacitor to electrical ground, where quarter wavelengths corresponding to lengths of the transmission lines for the first circuit arm can be different (e.g., associated with two different center frequencies of the superconducting device). As such, inductances of a superconducting device that combines and/or separates direct currents and microwave signals can be reduced. Furthermore, bandwidth of microwave signals transmitted by the superconducting device can be improved as well as isolation between microwave and direct current ports. The superconducting device can also be a superconducting direct-current and microwave combiner/separator device designed for narrowband communication or wideband communication. Moreover, isolation of the superconducting device can also be increased. Therefore, an improved superconducting device can be provided.

FIG. 1 illustrates a block diagram of an example, non-limiting system 100 that provides an improved superconducting device in accordance with one or more embodiments described herein. As disclosed herein, "superconducting device" can refer to a superconducting device that combines and/or separates direct currents and microwave signals that fall within its bandwidth. The system 100 can be, for example, a superconducting device (e.g., a superconducting circuit). In an embodiment, the system 100 can be associated with a superconducting combiner. In another embodiment, the system 100 can be associated with a superconducting separator. In certain embodiments, the system 100 can be realized on chip. In various embodiments, the system 100 can be associated with technologies such as, but not limited to, superconducting technologies, quantum hardware technologies, quantum amplifier technologies, tunable superconducting qubit technologies, microwave device technologies, quantum information processing technologies, and/or other technologies. The system 100 can employ hardware and/or software to solve problems that are highly technical in nature, that are not abstract and that cannot be performed as a set of mental acts by a human. Further, some of the processes performed may be performed by one or more specialized computers (e.g., one or more specialized circuits, one or more specialized hardware, etc.) for carrying out defined processes and/or tasks related to a superconducting device. The system 100 and/or components of the system can be employed to solve new problems that arise through advancements in technologies mentioned above, such as, for example, superconducting technologies, quantum hardware technologies, quantum amplifier technologies, tunable superconducting qubit technologies, microwave device technologies, quantum information processing technologies and the like. One or more embodiments of the system 100 can provide technical improvements to superconducting systems, quantum hardware systems, quantum amplifier systems, tunable superconducting qubit systems, microwave device systems, quantum information processing systems and/or other technical systems. One or more embodiments of the system 100 can also provide technical improvements to superconducting device by reducing inductances of the superconducting device, improving bandwidth of a signal transmitted by the superconducting device, configuring design of the superconducting device for narrowband communication or wideband communication, and/or increasing isolation of the superconducting device.

In the embodiment shown in FIG. 1, the system 100 can include a direct current circuit 102, a microwave circuit 104 and a common circuit 106. The direct current circuit 102 can provide transmission of a direct current signal (e.g., DIRECT CURRENT SIGNAL shown in FIG. 1). The microwave circuit 104 can provide transmission of a microwave signal (e.g., MICROWAVE SIGNAL shown in FIG. 1). The common circuit 106 can provide transmission of a combined signal (e.g., COMBINED SIGNAL shown in FIG. 1). The combined signal can be, for example, a combination of the direct current signal and the microwave signal. The direct current signal can be one or more direct current signals, the microwave signal can be one or more microwave signals, and the combined signal can be one or more combined signals. The direct current signal can be an electrical signal associated with flow of electrical current. The direct current signal can include a constant voltage and/or a constant current. The microwave signal can be a radio frequency signal associated with an oscillatory change in voltage and/or current. In an aspect, the microwave circuit 104 and the direct current circuit 102 can be joined by the common circuit 106. For instance, the direct current circuit 102 can be a first circuit arm that supports the direct current signal and the microwave circuit 104 can be a second circuit arm that supports the microwave signal. Furthermore, the common circuit 106 can be a third circuit arm that joins the direct current circuit 102 (e.g., the first circuit arm) and the microwave circuit 104 (e.g., the second circuit arm). The direct current circuit 102 can include a port 108, the microwave circuit 104 can include a port 110, and/or the common circuit 106 can include a port 112. The port 108, the port 110 and/or the port 112 can be, for example, one or more ports for a superconducting device. The port 108 of the direct current circuit 102 can be, for example, a DC-port. The port 110 of the microwave circuit 104 can be, for example, a microwave port. The port 112 of the common circuit 106 can be, for example, a common port. In another aspect, the direct current circuit 102, the microwave circuit 104 and the common circuit 106 can be implemented to combine or separate the direct current signal and the microwave signal. In an embodiment, the common circuit 106 can combine the direct current signal received via the port 108 and the microwave signal received via the port 110 to generate the combined signal that is output via the port 112. As such, in an embodiment, the direct current circuit 102, the microwave circuit 104 and the common circuit 106 can be implemented as a combiner circuit. In another embodiment, the common circuit 106 can separate the combined signal that is received via the port 112 into the direct current signal via the port 108 and the microwave signal via the port 108. As such, in another embodiment, the direct current circuit 102, the microwave circuit 104 and the common circuit 106 can be implemented as a separator circuit.

In one embodiment, the direct current circuit 102 can include a bandstop circuit. The bandstop circuit can be a bandstop filter that supports direct current signals and blocks transmission of one or more microwave signals within a bandwidth of a superconducting device. Furthermore, the microwave circuit 104 can include a capacitor. In another embodiment, the microwave circuit 104 can include a bandpass circuit. The bandpass circuit can be a bandpass filter that allows transmission of one or more microwave signals within a bandwidth of a superconducting device. Furthermore, the direct current circuit 102 can include a bandstop circuit that supports direct current signals and blocks transmission of one or more microwave signals within a bandwidth of a superconducting device. In yet another embodiment, the microwave circuit 104 can include a capacitor and the direct current circuit 102 can include a quarter-wavelength transmission line. The wavelength of the quarter-wavelength transmission line can refer to wavelength associated with a center frequency of a superconducting device. In one example, the quarter-wavelength transmission line can be shunted by a capacitor to electrical ground. In yet another embodiment, the microwave circuit 104 can include a capacitor and the direct current circuit 102 can include a first quarter-wavelength transmission line and a second quarter-wavelength transmission line. The wavelength of the first quarter-wavelength transmission line can refer to first wavelength associated with a first center frequency of a superconducting device and the wavelength of the second quarter-wavelength transmission line can refer to second wavelength associated with a second center frequency of the superconducting device. For example, wavelengths and/or lengths of the first quarter-wavelength transmission line and the second quarter-wavelength transmission line can be different. In one example, the first quarter-wavelength transmission line can be shunted by a first capacitor to electrical ground and the second quarter-wavelength transmission line can be shunted by a second capacitor to electrical ground.

Additionally, it is to be appreciated that the system 100 can provide various advantages as compared to conventional direct-current and microwave signal combiner/separator devices. For instance, by employing the system 100, the direct-current and microwave signal combiner/separator can be realized as on-chip superconducting circuit. The microwave bandwidth of the direct-current and microwave signal combiner/separator can also be improved. A superconducting device that includes the direct current circuit 102, the microwave circuit 104 and/or the common circuit 106 can also be provided for narrowband communication or wideband communication by employing the system 100. Moreover, isolation of a superconducting device that includes the direct current circuit 102, the microwave circuit 104 and the common circuit 106 can also be increased by employing the system 100.

Figure 2:
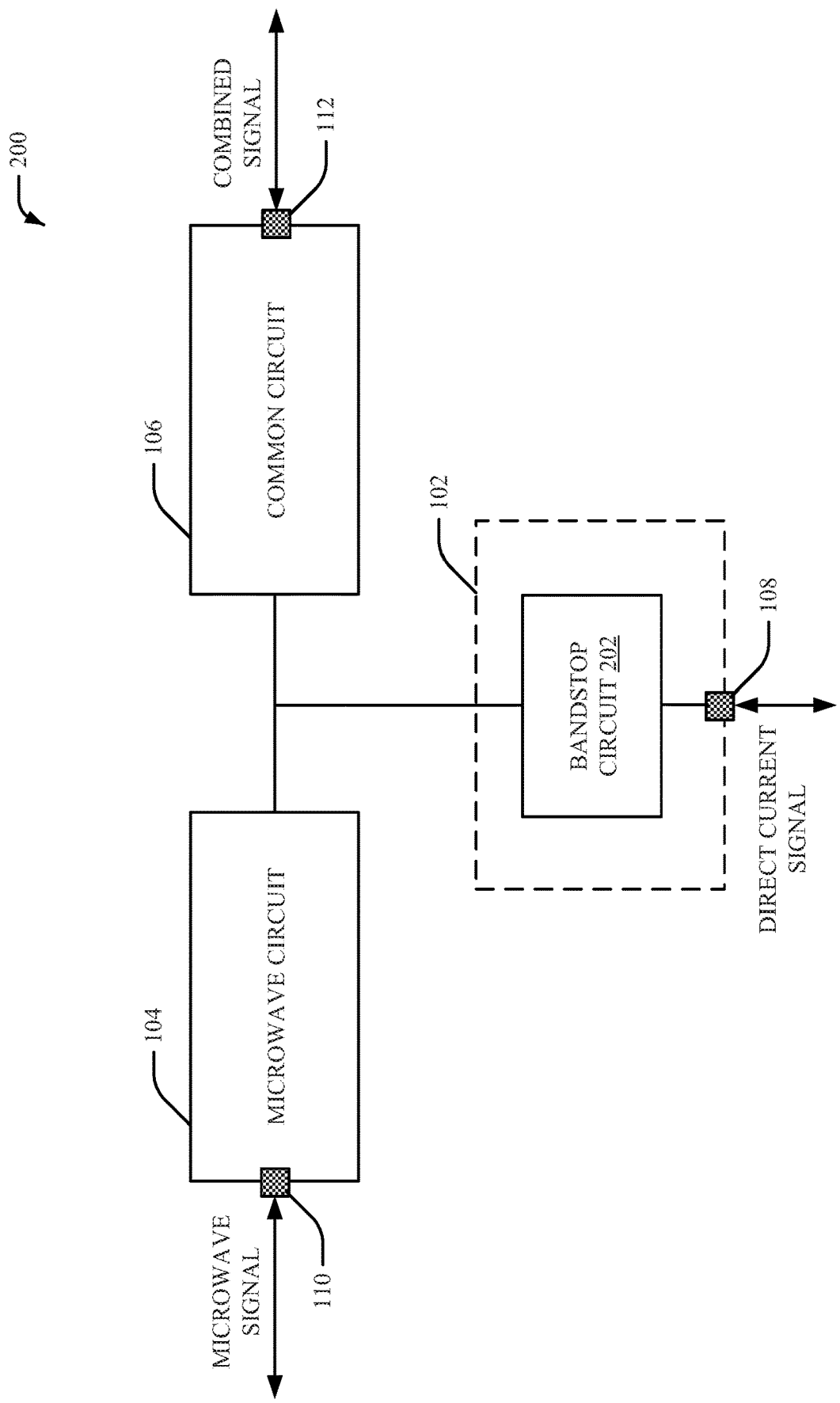
FIG. 2 illustrates an example, non-limiting system associated with a direct current circuit that includes a bandstop circuit, a microwave circuit and a common circuit in accordance with one or more embodiments described herein.

FIG. 2 illustrates a block diagram of an example, non-limiting system 200 in accordance with one or more embodiments described herein. Repetitive description of like elements employed in other embodiments described herein is omitted for sake of brevity.

The system 200 can be, for example, a superconducting device (e.g., a superconducting circuit). In an embodiment, the system 200 can be associated with a superconducting combiner. For instance, the system 200 can be associated with a superconducting direct-current and microwave signal combiner. In another embodiment, the system 200 can be associated with a superconducting separator. In certain embodiments, the system 200 can be realized on chip. The system 200 includes the direct current circuit 102, the microwave circuit 104 and the common circuit 106. In the embodiment shown in FIG. 2, the direct current circuit 102 can include a bandstop circuit 202. In an aspect, the direct current circuit 102 can include the port 108, the microwave circuit 104 can include the port 110, and/or the common circuit 106 can include the port 112. The bandstop circuit 202 can be, for example, a bandstop filter that filters (e.g., attenuates) a set of frequencies associated with the microwave signal. In an aspect, the bandstop circuit 202 can support transmission of the direct current signal. Furthermore, the bandstop circuit 202 can block transmission of a portion of the microwave signal within a bandwidth of a superconducting device that includes the direct current circuit 102, the microwave circuit 104 and/or the common circuit 106. In an aspect, the system 200 that includes the bandstop circuit 202 can be employed in an implemented where the microwave signal is within a certain bandwidth. In certain embodiments, the bandstop circuit 202 can include a set of quarter-wavelength transmission lines to facilitate blocking transmission of a portion of the microwave signal within a bandwidth of a superconducting device that includes the direct current circuit 102, the microwave circuit 104 and/or the common circuit 106. In certain embodiments, the microwave circuit 104 can include a capacitor to allow the microwave signal to be transmitted through the microwave circuit 104 via wideband communication.

Additionally, it is to be appreciated that the system 200 can provide various advantages as compared to conventional direct-current and microwave signal combiner/separator devices. For instance, by employing the system 200, the direct-current and microwave signal combiner/separator can be realized as on-chip superconducting circuit. The microwave bandwidth of the direct-current and microwave signal combiner/separator can also be improved. A superconducting device that includes the direct current circuit 102, the microwave circuit 104 and/or the common circuit 106 can also be provided for narrowband communication or wideband communication by employing the system 200. Moreover, isolation of a superconducting device that includes the direct current circuit 102, the microwave circuit 104 and the common circuit 106 can also be increased by employing the system 200.

Figure 3:
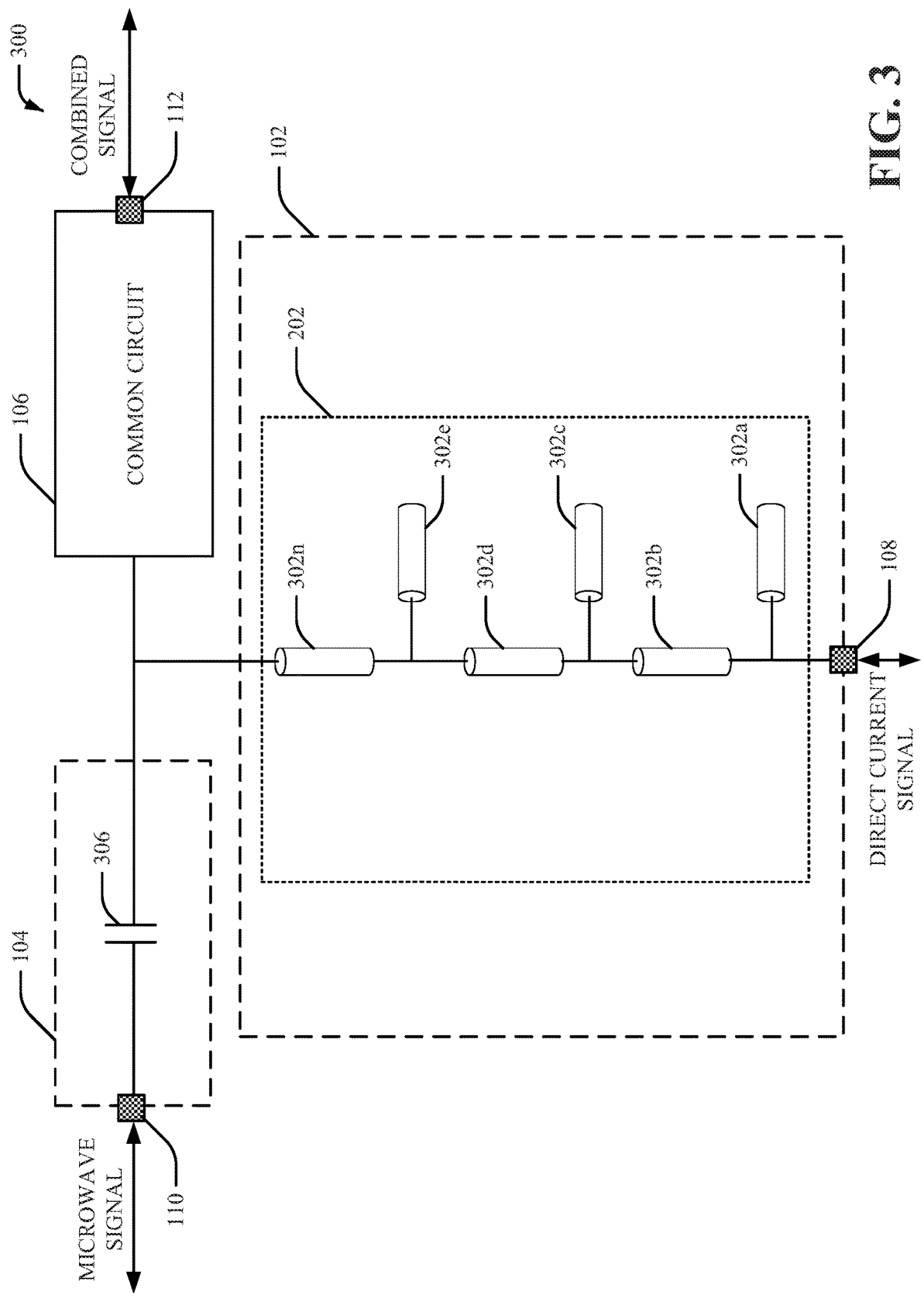
FIG. 3 illustrates another example, non-limiting system associated with a direct current circuit that includes a bandstop circuit, a microwave circuit and a common circuit in accordance with one or more embodiments described herein.

FIG. 3 illustrates a block diagram of an example, non-limiting system 300 in accordance with one or more embodiments described herein. Repetitive description of like elements employed in other embodiments described herein is omitted for sake of brevity.

The system 300 can be, for example, a superconducting device (e.g., a superconducting circuit). In an embodiment, the system 300 can be associated with a superconducting combiner. In another embodiment, the system 300 can be associated with a superconducting separator. In certain embodiments, the system 300 can be realized on chip. The system 300 includes the direct current circuit 102, the microwave circuit 104 and the common circuit 106. In the embodiment shown in FIG. 3, the direct current circuit 102 can include the bandstop circuit 202. In an aspect, the direct current circuit 102 can include the port 108, the microwave circuit 104 can include the port 110, and/or the common circuit 106 can include the port 112. The bandstop circuit 202 can include a set of transmission lines 302a-n. For example, the set of transmission lines 302a-n can be a set of quarter-wavelength transmission lines 302a-n. It is to be appreciated that, in certain embodiments, the bandstop circuit 202 can include a different number of transmission lines. For example, in certain embodiments, less than three unit cells associate with the set of quarter-wavelength transmission lines 302a-n, or more than three unit cells associated with the set of quarter-wavelength transmission lines 302a-n, can be employed by the bandstop circuit 202. In an embodiment, the transmission line 302a and the transmission line 302b can be electrically coupled to the port 108. Furthermore, the transmission line 302b can be electrically coupled to the transmission line 302c and the transmission line 302d. The transmission line 302d can also be electrically coupled to the transmission line 302e and/or the transmission line 302n. The transmission line 302n can also be electrically coupled to the microwave circuit 104 and the common circuit 106. Furthermore, the transmission line 302a, the transmission line 302c and the transmission line 302e can be open-ended transmission line stubs. In one embodiment, the microwave circuit 104 can include a capacitor 306. The capacitor can be electrically coupled to the port 110. Furthermore, the capacitor can be electrically coupled to the common circuit 106 and the direct current circuit 102 (e.g., the transmission line 302n of the direct current circuit 102). The transmission lines 302a-n can include a corresponding length equal to a quarter-wavelength where wavelength refers to a wavelength associated with a center frequency of a superconducting device that includes the direct current circuit 102, the microwave circuit 104 and/or the common circuit 106. In one example, the transmission lines 302a-n can block transmission of a signal at 7 GHz.

In a non-limiting example, the transmission line 302a can include a first impedance value (e.g., a first impedance value equal to 265.9 Ohms), the transmission line 302b can include a second impedance value (e.g., a second impedance value equal to 50 Ohms), the transmission line 302c can include a third impedance value (e.g., a third impedance value equal to 387 Ohms), the transmission line 302d can include the second impedance value (e.g., the second impedance value equal to 50 Ohms), and the transmission line 302e can include the first impedance value (e.g., the first impedance value equal to 265.9 Ohms). Furthermore, the transmission line 302n can include the second impedance value (e.g., the second impedance value equal to 50 Ohms). The capacitor 306 can include, for example, a capacitance value equal to 8 pF. However, it is to be appreciated that the transmission lines 302a-n and/or the capacitor 306 can include different values, different lengths, and/or a different number of unit cells.

Additionally, it is to be appreciated that the system 300 can provide various advantages as compared to conventional direct-current and microwave signal combiner/separator devices. For instance, by employing the system 300, the direct-current and microwave signal combiner/separator can be realized as on-chip superconducting circuit. The microwave bandwidth of the direct-current and microwave signal combiner/separator can also be improved. A superconducting device that includes the direct current circuit 102, the microwave circuit 104 and/or the common circuit 106 can also be provided for narrowband communication or wideband communication by employing the system 300. Moreover, isolation of a superconducting device that includes the direct current circuit 102, the microwave circuit 104 and the common circuit 106 can also be increased by employing the system 300.

Figure 4:
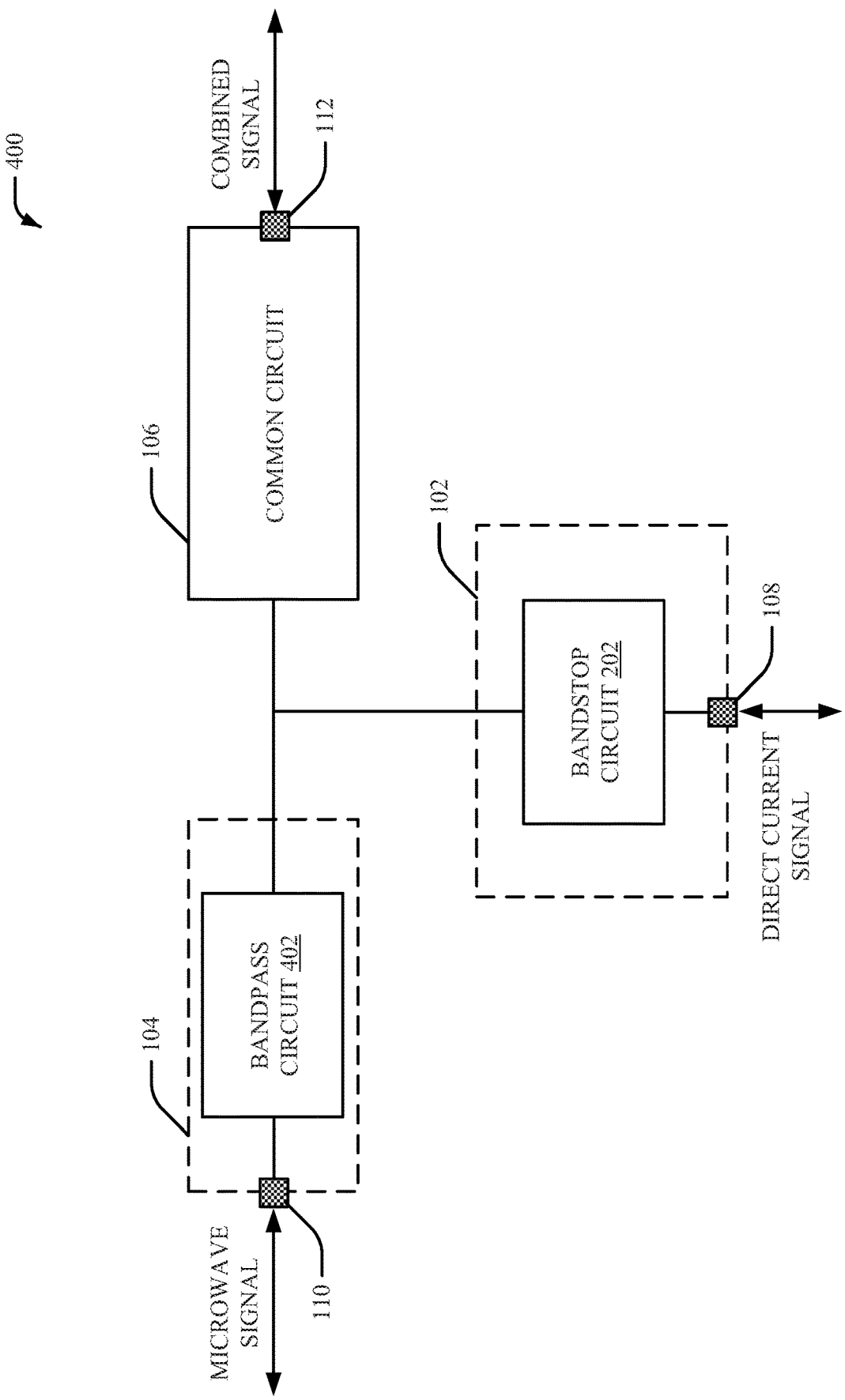
FIG. 4 illustrates an example, non-limiting system associated with a direct current circuit that includes a bandstop circuit, a microwave circuit that includes a bandpass circuit, and a common circuit in accordance with one or more embodiments described herein.

FIG. 4 illustrates a block diagram of an example, non-limiting system 400 in accordance with one or more embodiments described herein. Repetitive description of like elements employed in other embodiments described herein is omitted for sake of brevity.

The system 400 can be, for example, a superconducting device (e.g., a superconducting circuit). In an embodiment, the system 400 can be associated with a superconducting combiner. In another embodiment, the system 400 can be associated with a superconducting separator. In certain embodiments, the system 400 can be realized on chip. The system 400 includes the direct current circuit 102, the microwave circuit 104 and the common circuit 106. In the embodiment shown in FIG. 4, the direct current circuit 102 can include the bandstop circuit 202 and the microwave circuit 104 can include a bandpass circuit 402. In an aspect, the direct current circuit 102 can include the port 108, the microwave circuit 104 can include the port 110, and/or the common circuit 106 can include the port 112. The bandpass circuit 402 can be, for example, a bandpass filter that filters (e.g., attenuates) a set of frequencies associated with the microwave signal. In an aspect, the bandpass circuit 402 can allow transmission of a portion of the microwave signal within a bandwidth of a superconducting device that includes the direct current circuit 102, the microwave circuit 104 and/or the common circuit 106. In an aspect, the system 400 that includes the bandpass circuit 402 can be employed in an implemented where the microwave signal is within a certain bandwidth. In certain embodiments, the bandpass circuit 402 can include a set of lumped circuit elements to facilitate allowing transmission of a portion of the microwave signal within a bandwidth of a superconducting device that includes the direct current circuit 102, the microwave circuit 104 and/or the common circuit 106. For instance, the bandpass circuit 402 can include a set of inductors and/or a set of capacitors to facilitate allowing transmission of a portion of the microwave signal within a bandwidth of a superconducting device that includes the direct current circuit 102, the microwave circuit 104 and/or the common circuit 106. Additionally, in an aspect, the bandstop circuit 202 can be a bandstop filter that filters (e.g., attenuates) a set of frequencies associated with the microwave signal. The bandstop circuit 202 can support transmission of the direct current signal. Furthermore, the bandstop circuit 202 can block transmission of a portion of the microwave signal within a bandwidth of a superconducting device that includes the direct current circuit 102, the microwave circuit 104 and/or the common circuit 106. In certain embodiments, the bandstop circuit 202 can include a set of quarter-wavelength transmission lines to facilitate blocking transmission of a portion of the microwave signal within a bandwidth of a superconducting device that includes the direct current circuit 102, the microwave circuit 104 and/or the common circuit 106. For example, the bandstop circuit 202 can include the transmission lines 302a-n.

Additionally, it is to be appreciated that the system 400 can provide various advantages as compared to conventional direct-current and microwave signal combiner/separator devices. For instance, by employing the system 400, the direct-current and microwave signal combiner/separator can be realized as on-chip superconducting circuit. The microwave bandwidth of the direct-current and microwave signal combiner/separator can also be improved. A superconducting device that includes the direct current circuit 102, the microwave circuit 104 and/or the common circuit 106 can also be provided for narrowband communication or wideband communication by employing the system 400. Moreover, isolation of a superconducting device that includes the direct current circuit 102, the microwave circuit 104 and the common circuit 106 can also be increased by employing the system 400.

Figure 5:
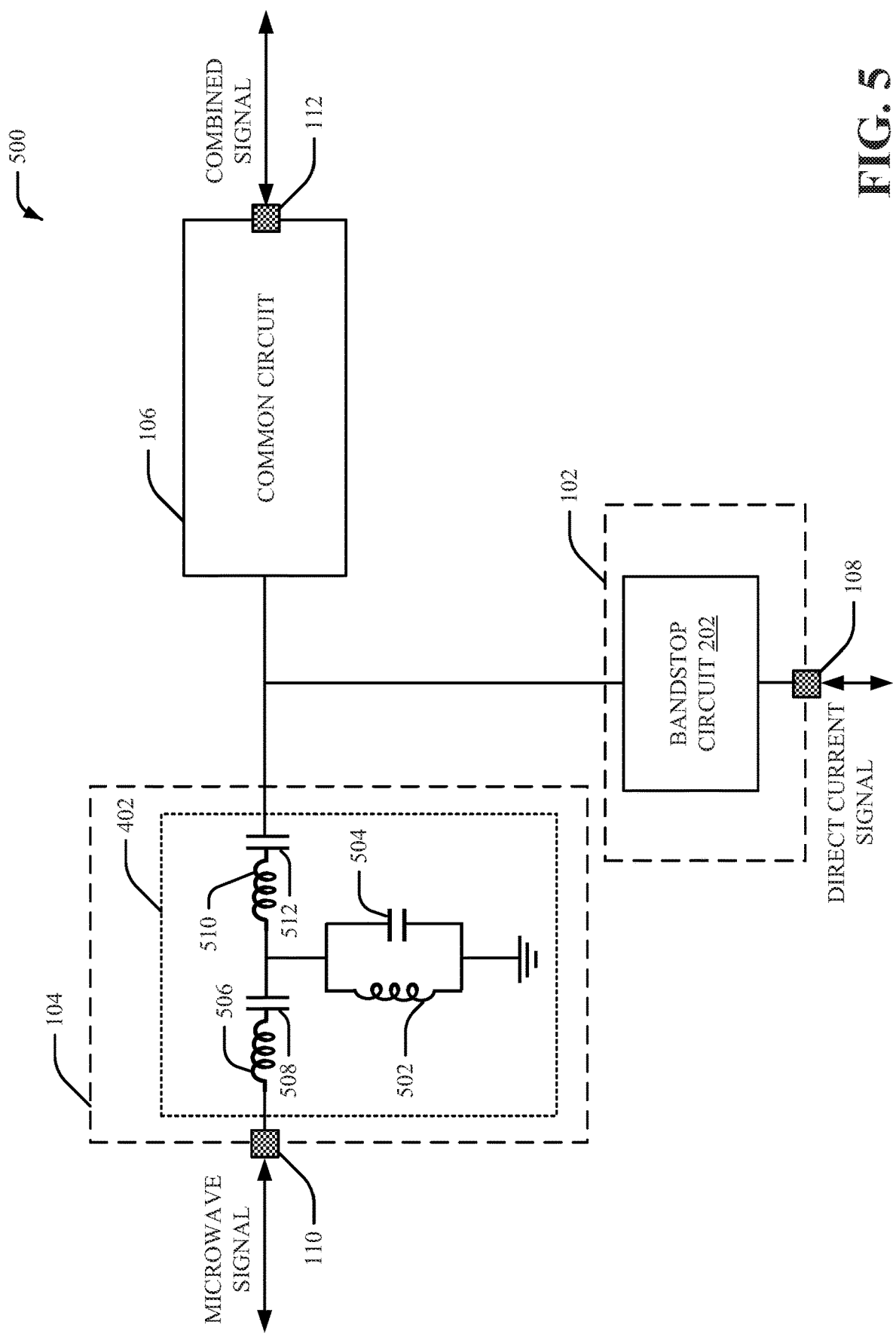
FIG. 5 illustrates another example, non-limiting system associated with a direct current circuit that includes a bandstop circuit, a microwave circuit that includes a bandpass circuit, and a common circuit in accordance with one or more embodiments described herein.

FIG. 5 illustrates a block diagram of an example, non-limiting system 500 in accordance with one or more embodiments described herein. Repetitive description of like elements employed in other embodiments described herein is omitted for sake of brevity.

The system 500 can be, for example, a superconducting device (e.g., a superconducting circuit). In an embodiment, the system 500 can be associated with a superconducting combiner. In another embodiment, the system 500 can be associated with a superconducting separator. In certain embodiments, the system 500 can be realized on chip. The system 500 includes the direct current circuit 102, the microwave circuit 104 and the common circuit 106. In the embodiment shown in FIG. 5, the direct current circuit 102 can include the bandstop circuit 202 and the microwave circuit 104 can include the bandpass circuit 402. In an aspect, the direct current circuit 102 can include the port 108, the microwave circuit 104 can include the port 110, and/or the common circuit 106 can include the port 112. The bandpass circuit 402 can include an inductor 502, a capacitor 504, an inductor 506, a capacitor 508, an inductor 510 and/or a capacitor 512. The inductor 502, the capacitor 504, the inductor 506, the capacitor 508, the inductor 510 and/or the capacitor 512 can be implemented, for example, as a set of lumped elements. It is to be appreciated that, in certain embodiments, a position/location for the inductor 506 and the capacitor 508 can be swapped without affecting performance. Additionally or alternatively, it is to be appreciated that, in certain embodiments, a position/location for the inductor 510 and the capacitor 512 can be swapped without affecting performance. Moreover, it is to be appreciated that, in certain embodiments, the bandpass circuit 402 can include a different number of unit cells than illustrated in FIG. 5. In an aspect, the inductor 506 can be electrically coupled to the port 110. Furthermore, the inductor 506 can be electrically coupled to the capacitor 508. The capacitor 508 can also be electrically coupled to the inductor 502, the capacitor 504 and the inductor 510. The inductor 502 and the capacitor 504 can be implemented in parallel. Furthermore, the inductor 502 and the capacitor 504 can be electrically coupled to electrical ground. The inductor 510 can also be electrically coupled to the capacitor 512. The capacitor 512 can also be electrically coupled to the common circuit 106 and the direct current circuit 102 (e.g., the bandstop circuit 202 of the direct current circuit 102). In a non-limiting example, the inductor 502 can include an inductance value equal to 0.156 nH, the capacitor 504 can include a capacitance value equal to 3.32 pF, the inductor 506 can include an inductance value equal to 12.1 nH, the capacitor 508 can include a capacitance value equal to 42.7 fF, the inductor 510 can include an inductance value equal to 12.1 nH, and the capacitor 512 can include a capacitance value equal to 42.7 fF. However, it is to be appreciated that the inductor 502, the capacitor 504, the inductor 506, the capacitor 508, the inductor 510 and/or the capacitor 512 can include a different value.

Additionally, it is to be appreciated that the system 500 can provide various advantages as compared to conventional direct-current and microwave signal combiner/separator devices. For instance, by employing the system 500, the direct-current and microwave signal combiner/separator can be realized as on-chip superconducting circuit. The microwave bandwidth of the direct-current and microwave signal combiner/separator can also be improved. A superconducting device that includes the direct current circuit 102, the microwave circuit 104 and/or the common circuit 106 can also be provided for narrowband communication or wideband communication by employing the system 500. Moreover, isolation of a superconducting device that includes the direct current circuit 102, the microwave circuit 104 and the common circuit 106 can also be increased by employing the system 500.

Figure 6:
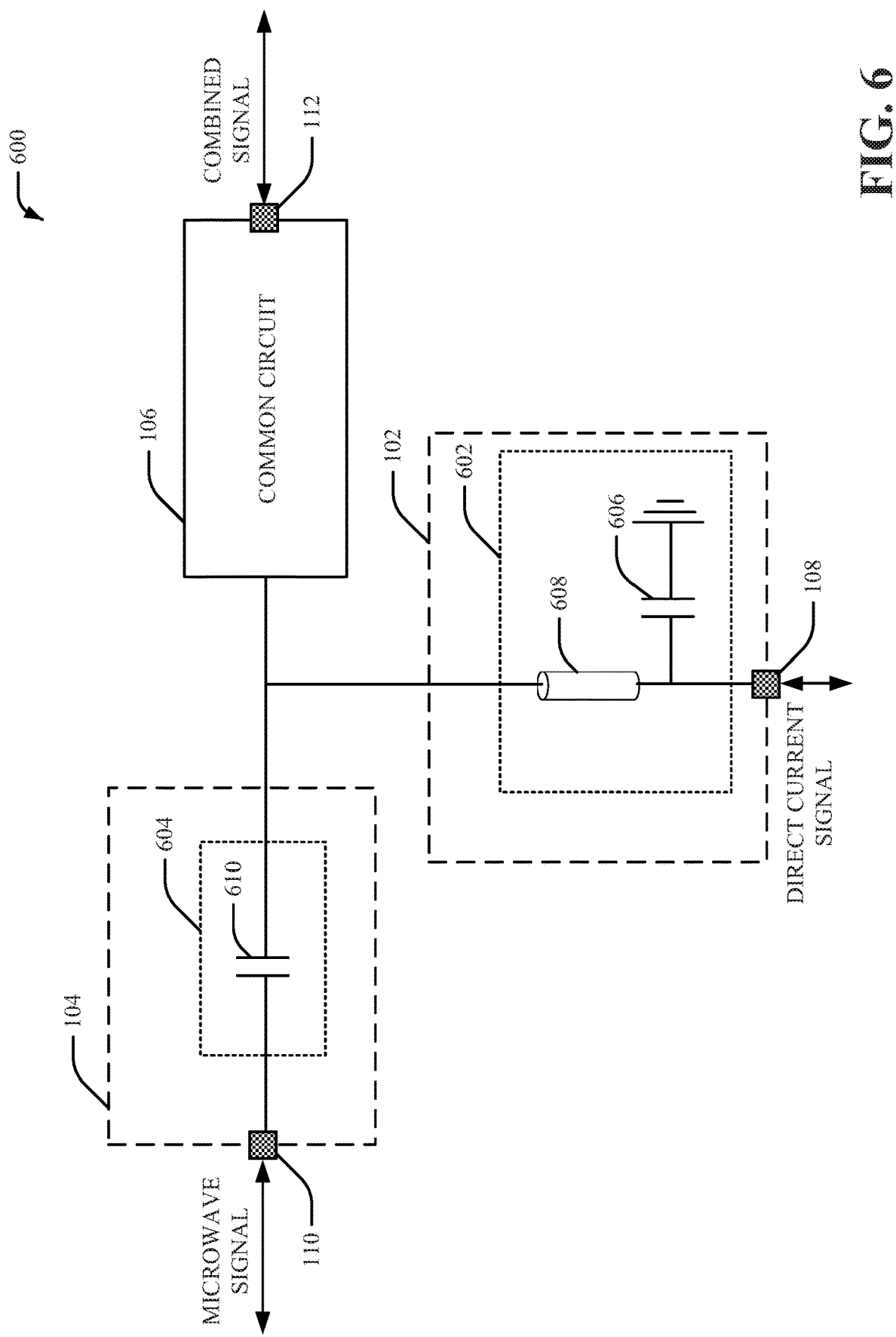
FIG. 6 illustrates another example, non-limiting system associated with a direct current circuit, a microwave circuit and a common circuit in accordance with one or more embodiments described herein.

FIG. 6 illustrates a block diagram of an example, non-limiting system 600 in accordance with one or more embodiments described herein. Repetitive description of like elements employed in other embodiments described herein is omitted for sake of brevity.

The system 600 can be, for example, a superconducting device (e.g., a superconducting circuit). In an embodiment, the system 600 can be associated with a superconducting combiner. In another embodiment, the system 600 can be associated with a superconducting separator. In certain embodiments, the system 600 can be realized on chip. The system 600 includes the direct current circuit 102, the microwave circuit 104 and the common circuit 106. In the embodiment shown in FIG. 6, the direct current circuit 102 can include a circuit 602 and the microwave circuit 104 can include a circuit 604. In an aspect, the circuit 602 can facilitate blocking transmission of one or more microwave signals within a bandwidth of a superconducting device that includes the direct current circuit 102, the microwave circuit 104 and/or the common circuit 106. Furthermore, the circuit 604 can facilitate allowing transmission of one or more microwave signals within a bandwidth of a superconducting device that includes the direct current circuit 102, the microwave circuit 104 and/or the common circuit 106. The circuit 602 can include a capacitor 606 and a transmission line 608. The transmission line 608 can be, for example, a quarter-wavelength transmission line where wavelength refers to a wavelength associated with a center frequency of a superconducting device that includes the direct current circuit 102, the microwave circuit 104 and/or the common circuit 106. The capacitor 606 and the transmission line 608 can be electrically coupled to the port 108. The capacitor 606 can also be electrically coupled to electrical ground. The transmission line 608 can also be electrically coupled to the common circuit and the microwave circuit 104 (e.g., the capacitor 610 of the microwave circuit 104). In one example, the transmission line 608 and the capacitor 606 can block microwave signals within a large bandwidth centered at 7 GHz. In an aspect, the system 600 that includes the circuit 602 and the circuit 604 can be employed in an implemented for microwave signals associated with wideband communication. In a non-limiting example, the capacitor 606 can include a capacitance value equal to 20 pF, the transmission line 608 can include an impedance value equal to 50 Ohms, and the capacitor 610 can include a capacitance value equal to 10 pF. However, it is to be appreciated that the capacitor 606, the transmission line 608, and/or the capacitor 610 can have different values.

Additionally, it is to be appreciated that the system 600 can provide various advantages as compared to conventional direct-current and microwave signal combiner/separator devices. For instance, by employing the system 600, the direct-current and microwave signal combiner/separator can be realized as on-chip superconducting circuit. The microwave bandwidth of the direct-current and microwave signal combiner/separator can also be improved. A superconducting device that includes the direct current circuit 102, the microwave circuit 104 and/or the common circuit 106 can also be provided for narrowband communication or wideband communication by employing the system 600. Moreover, isolation of a superconducting device that includes the direct current circuit 102, the microwave circuit 104 and the common circuit 106 can also be increased by employing the system 600.

Figure 7:
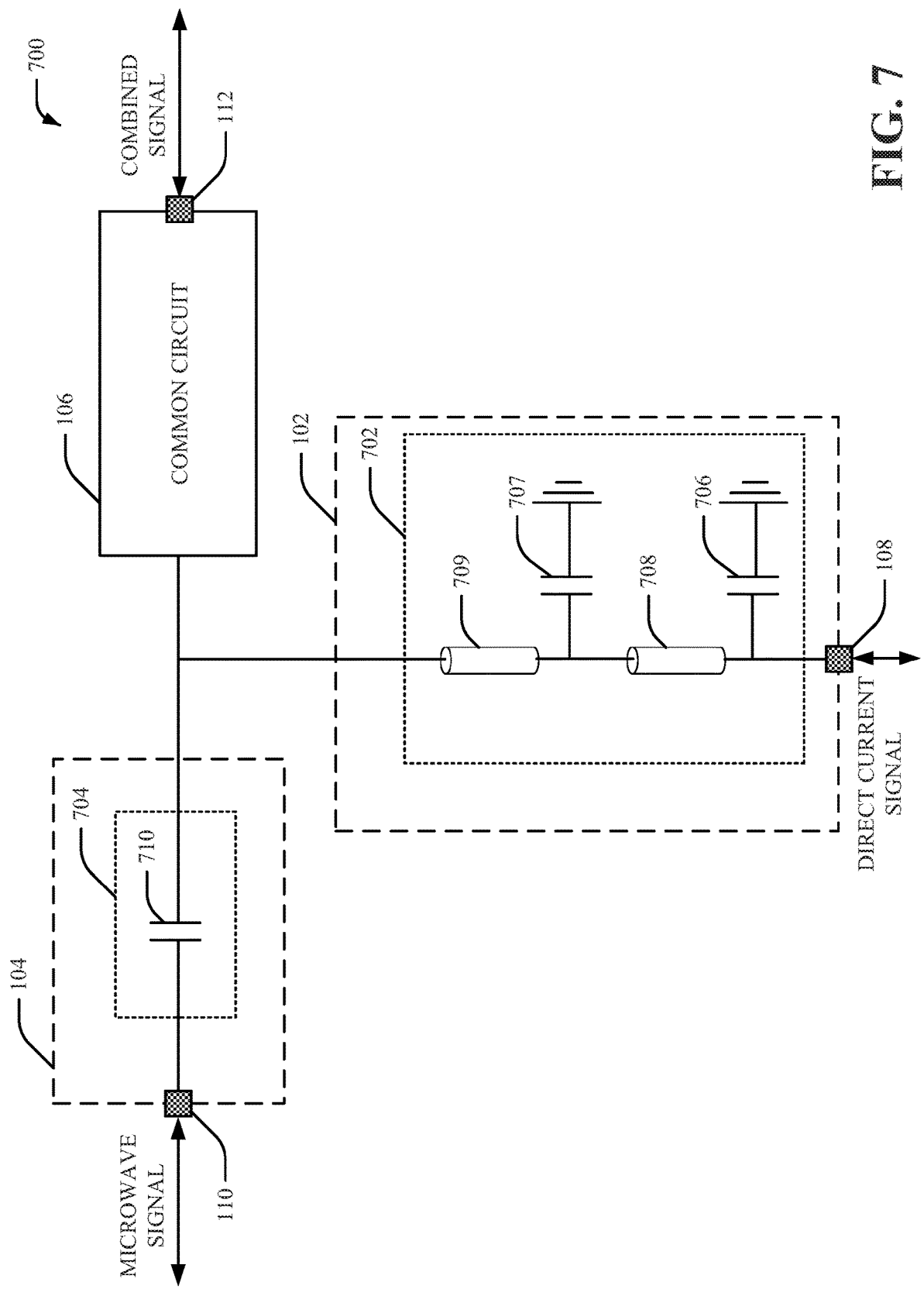
FIG. 7 illustrates yet another example, non-limiting system associated with a direct current circuit, a microwave circuit and a common circuit in accordance with one or more embodiments described herein.

FIG. 7 illustrates a block diagram of an example, non-limiting system 700 in accordance with one or more embodiments described herein. Repetitive description of like elements employed in other embodiments described herein is omitted for sake of brevity.

The system 700 can be, for example, a superconducting device (e.g., a superconducting circuit). In an embodiment, the system 700 can be associated with a superconducting combiner. In another embodiment, the system 700 can be associated with a superconducting separator. In certain embodiments, the system 700 can be realized on chip. The system 700 includes the direct current circuit 102, the microwave circuit 104 and the common circuit 106. In the embodiment shown in FIG. 7, the direct current circuit 102 can include a circuit 702 and the microwave circuit 104 can include a circuit 704. In an aspect, the circuit 702 can facilitate blocking transmission of one or more microwave signals within a bandwidth of a superconducting device that includes the direct current circuit 102, the microwave circuit 104 and/or the common circuit 106. Furthermore, the circuit 704 can facilitate allowing transmission of one or more microwave signals within a bandwidth of a superconducting device that includes the direct current circuit 102, the microwave circuit 104 and/or the common circuit 106. The circuit 702 can include a capacitor 706, a transmission line 708, a capacitor 707 and a transmission line 709. The transmission line 708 and the transmission line 709 can be, for example, a quarter-wavelength transmission line where wavelength refers to a wavelength associated with a center frequency of a superconducting device that includes the direct current circuit 102, the microwave circuit 104 and/or the common circuit 106. The capacitor 706 and the transmission line 708 can be electrically coupled to the port 108. The capacitor 706 can also be electrically coupled to electrical ground. The transmission line 708 can also be electrically coupled to the capacitor 707 and the transmission line 709. The capacitor 707 can also be electrically coupled to electrical ground. Furthermore, the transmission line 709 can also be electrically coupled to the common circuit and the microwave circuit 104 (e.g., the capacitor 710 of the microwave circuit 104). In one example, length of the transmission line 708 can be equal a quarter wavelength at 11 GHz and length of the transmission line 709 can be equal to a quarter wavelength at 7 GHz. In an aspect, the system 700 that includes the circuit 702 and the circuit 704 can be employed in an implemented for microwave signals associated with high isolation and/or wideband communication. In a non-limiting example, the capacitor 706 can include a capacitance value equal to 20 pF, the transmission line 708 can include an impedance value equal to 50 Ohms, the capacitor 707 can include a capacitance value equal to 20 pF, the transmission line 709 can include an impedance value equal to 50 Ohms, and the capacitor 710 can include a capacitance value equal to 10 pF. However, it is to be appreciated that the capacitor 706, the transmission line 708, the capacitor 707, the transmission line 709, and/or the capacitor 710 can include different values.

Additionally, it is to be appreciated that the system 700 can provide various advantages as compared to conventional direct-current and microwave signal combiner/separator devices. For instance, by employing the system 700, the direct-current and microwave signal combiner/separator can be realized as on-chip superconducting circuit. The microwave bandwidth of the direct-current and microwave signal combiner/separator can also be improved. A superconducting device that includes the direct current circuit 102, the microwave circuit 104 and/or the common circuit 106 can also be provided for narrowband communication or wideband communication by employing the system 700. Moreover, isolation of a superconducting device that includes the direct current circuit 102, the microwave circuit 104 and the common circuit 106 can also be increased by employing the system 700.

Figure 8:
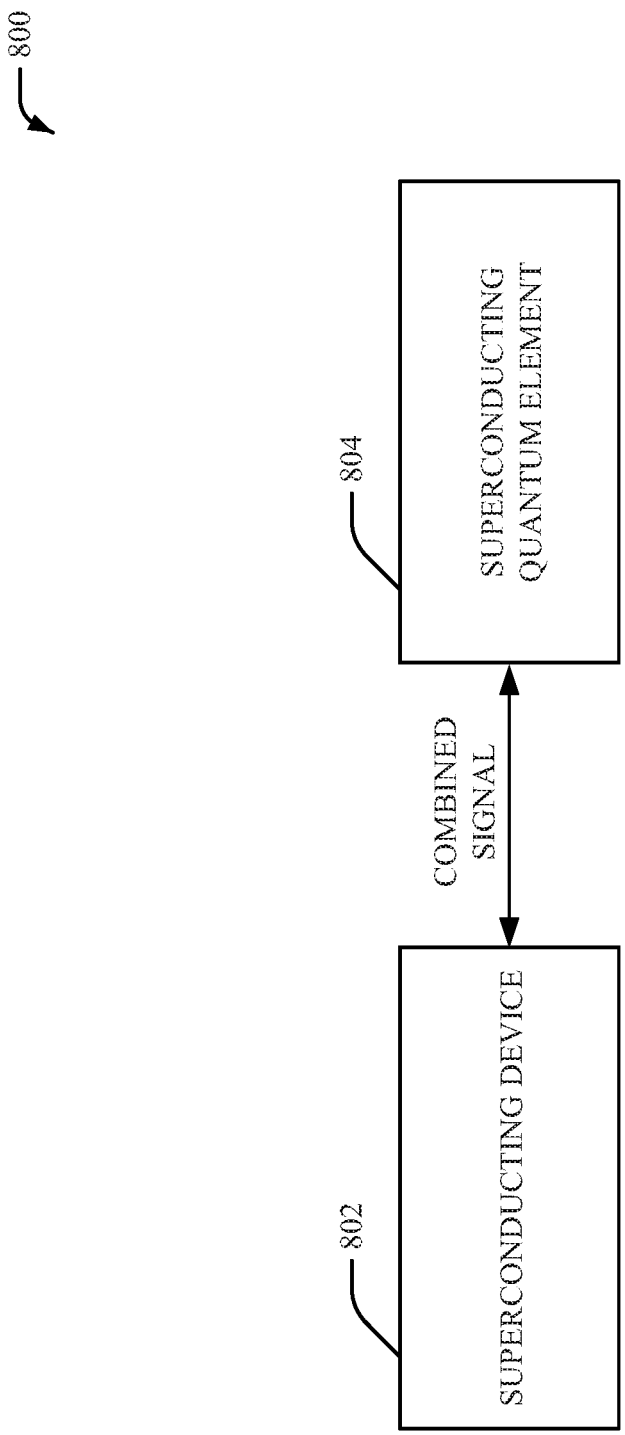
FIG. 8 illustrates another example, non-limiting system associated with a superconducting device and a superconducting quantum element in accordance with one or more embodiments described herein.

FIG. 8 illustrates a block diagram of an example, non-limiting system 800 in accordance with one or more embodiments described herein. Repetitive description of like elements employed in other embodiments described herein is omitted for sake of brevity.

The system 800 can include a superconducting device 802 and a superconducting quantum element 804. The superconducting device 802 can correspond to the system 100, the system 200, the system 300, the system 400, the system 500, the system 600, and/or the system 700. For example, the superconducting device 802 can include the direct current circuit 102, the microwave circuit 104 and/or the common circuit 106. In an aspect, the combined signal can be communicated between the superconducting device 802 and the superconducting quantum element 804. For example, the combined signal can be communicated between the superconducting device 802 and the superconducting quantum element 804 via the port 112 of the common circuit 106. In an embodiment, the superconducting quantum element 804 can be a quantum-limited amplifier. In one example, the superconducting quantum element 804 can be a Josephson Parametric Converter (JPC). For instance, the superconducting device 802 can be employed to combine a pump tone that drives the superconducting quantum element 804 (e.g., the JPC) and the direct current signal that flux-biases the superconducting quantum element 804 (e.g., the JPC). Furthermore, the superconducting device 802 can provide the combined signal into an on-chip, pump line of the superconducting quantum element 804 (e.g., the JPC) that can support the direct current signal and/or the microwave signal. In another example, the superconducting quantum element 804 can be a Kinetic Inductance Traveling (KIT) wave amplifier. For instance, the superconducting device 802 can be employed to combine the direct current signal that biases the superconducting quantum element 804 (e.g., the KIT wave amplifier) and the microwave signal to be amplified. Furthermore, the superconducting device 802 can provide the direct current signal and the microwave signal to an input of the superconducting quantum element 804 (e.g., the KIT wave amplifier) via the combined signal. Moreover, in an embodiment, the superconducting device 802 can be employed to separate the microwave signal (e.g., an amplified quantum microwave signal) and the direct current signal that biases the superconducting quantum element 804 (e.g., the KIT wave amplifier) at an output of the superconducting quantum element 804 (e.g., the KIT wave amplifier). In another embodiment, the superconducting quantum element 804 can be a qubit. For example, the superconducting quantum element 804 can be a tunable superconducting qubit. In an aspect, the superconducting device 802 can drive and/or flux-bias the superconducting quantum element 804 (e.g., the qubit) via the combined signal. However, it is to be appreciated that the superconducting quantum element 804 can be a different type of quantum element and/or the superconducting device 802 can be employed for a different type of implementation associated with quantum computing.

Figure 9:
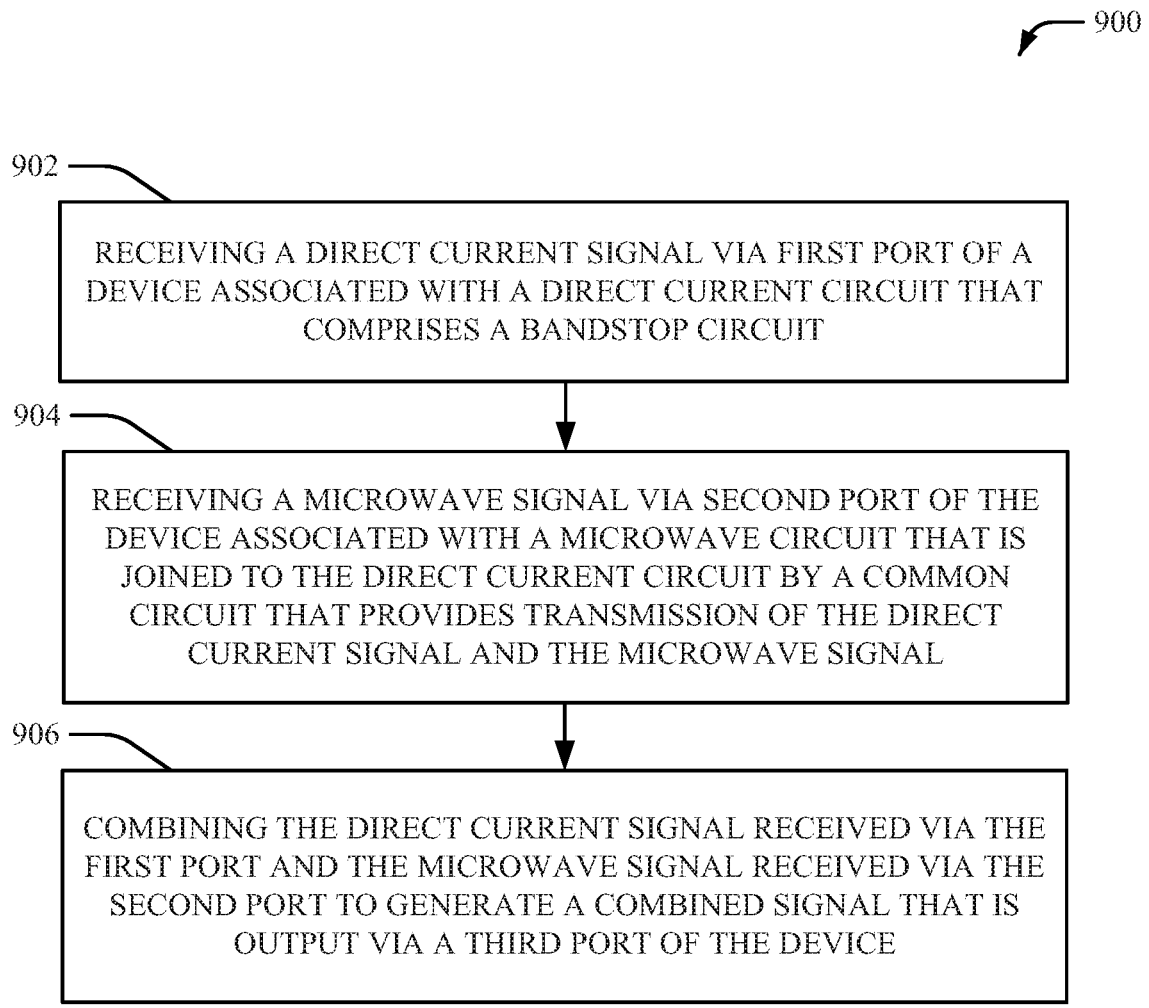
FIG. 9 illustrates a flow diagram of an example, non-limiting computer-implemented method for providing a superconducting combiner of DC-currents and microwave signals in accordance with one or more embodiments described herein.

FIG. 9 illustrates a flow diagram of an example, non-limiting method 900 for providing a superconducting combiner of DC-currents and microwave signals in accordance with one or more embodiments described herein. At 902, a direct current signal is received via first port of a device associated with a direct current circuit (e.g., direct current circuit 102) that comprises a bandstop circuit. The direct current signal can be an electrical signal associated with flow of electrical current. The direct current signal can include a constant voltage and/or a constant current. The first port can be, for example, a DC port. The device can be, for example, a superconducting device. In an aspect, the direct current circuit can be a first circuit arm that supports the direct current signal. The bandstop circuit can be a bandstop filter that supports direct current signals and blocks transmission of one or more microwave signals within a bandwidth of the device that includes the direct current circuit. In an embodiment, the bandstop circuit can include a set of quarter-wavelength transmission lines that facilitate blocking transmission of one or more microwave signals within a bandwidth of the device that includes the direct current circuit. In another embodiment, the bandstop circuit can include a quarter-wavelength transmission line and a capacitor that facilitates blocking transmission of one or more microwave signals within a bandwidth of the device that includes the direct current circuit.

At 904, a microwave signal is received via second port of the device associated with a microwave circuit (e.g., microwave circuit 104) that is joined to the direct current circuit by a common circuit (e.g., common circuit 106) that provides transmission of the direct current signal and the microwave signal. The microwave signal can be a radio frequency signal associated with an oscillatory change in voltage and/or current. The second port can be, for example, a microwave port. In an aspect, the microwave circuit can be a second circuit arm that supports the microwave signal. Furthermore, the common circuit can be a third circuit arm that supports the direct current signal and the microwave signal. The microwave circuit can allow transmission of one or more microwave signals within a bandwidth of the device that includes the direct current circuit, the microwave circuit and/or the common circuit. In an embodiment, the microwave circuit can include a capacitor that facilitates allowing transmission of one or more microwave signals within a bandwidth of the device. In another embodiment, the microwave circuit can include a bandpass circuit. The bandpass circuit can be a bandpass filter that allows transmission of one or more microwave signals within a bandwidth of the device.

At 906, the direct current signal received via the first port and the microwave signal received via the second port are combined to generate a combined signal that is output via a third port of the device. The third port can be, for example, a common port. As such, the device can be implemented as a combiner circuit. In an embodiment, the combined signal can be provided to a quantum element. For example, the combined signal can be provided to a quantum-limited amplifier (e.g., a JPC or a KIT wave amplifier). In another example, the combined signal can be provided to a qubit (e.g., a tunable superconducting qubit).

Figure 10:
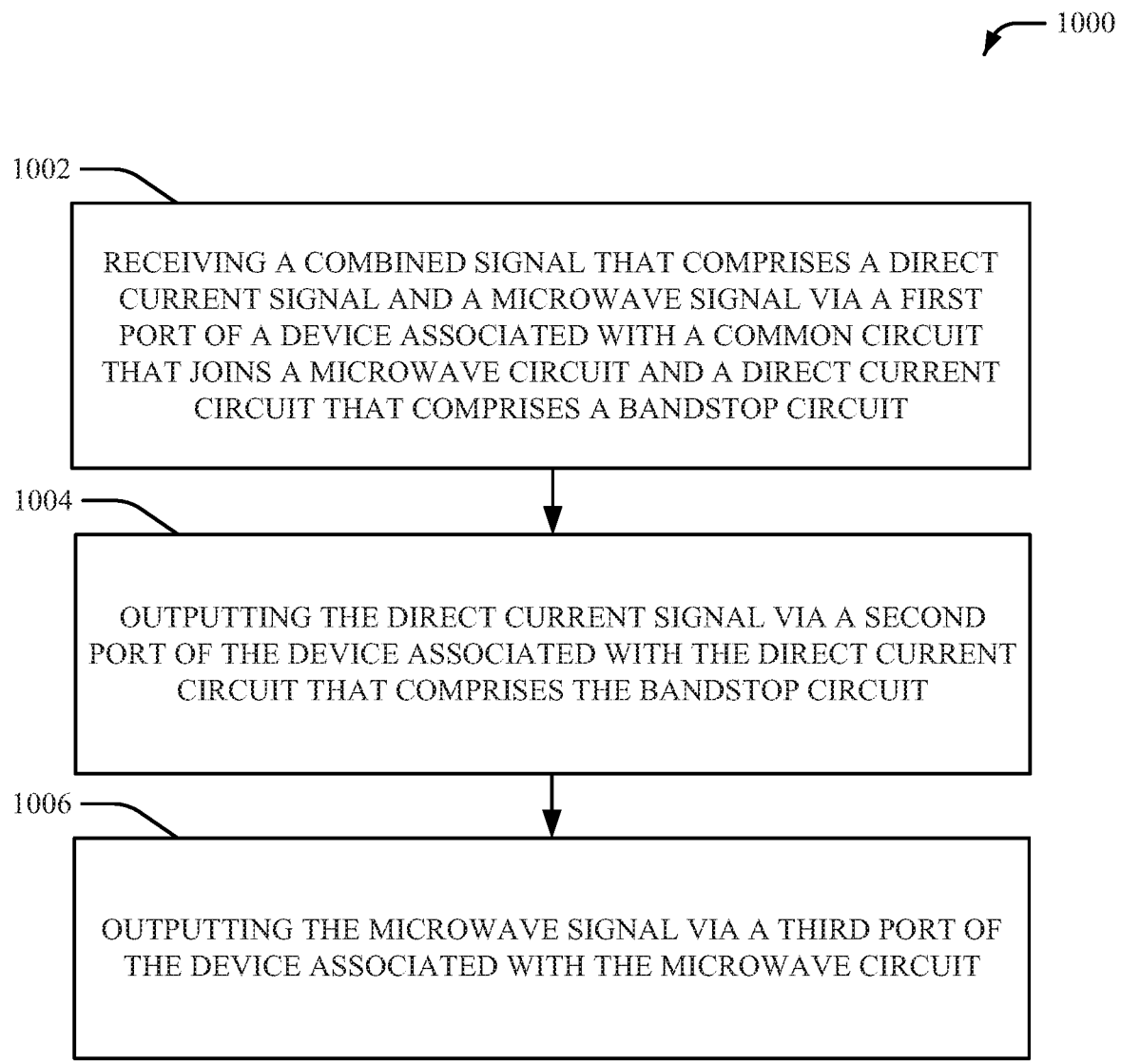
FIG. 10 illustrates a flow diagram of an example, non-limiting computer-implemented method for providing a superconducting separator of DC-currents and microwave signals in accordance with one or more embodiments described herein.

FIG. 10 illustrates a flow diagram of an example, non-limiting method 1000 for providing a superconducting separator of DC-currents and microwave signals in accordance with one or more embodiments described herein. At 1002, a combined signal that comprises a direct current signal and a microwave signal is received via a first port of a device associated with a common circuit (e.g., common circuit 106) that joins a microwave circuit (e.g., microwave circuit 104) and a direct current circuit (e.g., direct current circuit 102) that comprises a bandstop circuit. The direct current signal can be an electrical signal associated with flow of electrical current. The direct current signal can include a constant voltage and/or a constant current. The microwave signal can be a radio frequency signal associated with an oscillatory change in voltage and/or current. The first port can be, for example, a common port. The device can be, for example, a superconducting device. In an aspect, the direct current circuit can be a first circuit arm that supports the direct current signal. The microwave circuit can be a second circuit arm that supports the microwave signal. Furthermore, the common circuit can be a third circuit arm that supports the direct current signal and the microwave signal. The bandstop circuit can be a bandstop filter that supports direct current signals and blocks transmission of one or more microwave signals within a bandwidth of the device that includes the direct current circuit. In an embodiment, the bandstop circuit can include a set of quarter-wavelength transmission lines that facilitate blocking transmission of one or more microwave signals within a bandwidth of the device that includes the direct current circuit. In another embodiment, the bandstop circuit can include a quarter-wavelength transmission line and a capacitor that facilitate blocking transmission of one or more microwave signals within a bandwidth of the device that includes the direct current circuit. The microwave circuit can allow transmission of one or more microwave signals within a bandwidth of the device that includes the direct current circuit, the microwave circuit and/or the common circuit. In an embodiment, the microwave circuit can include a capacitor that facilitates allowing transmission of one or more microwave signals within a bandwidth of the device. In another embodiment, the microwave circuit can include a bandpass circuit. The bandpass circuit can be a bandpass filter that allows transmission of one or more microwave signals within a bandwidth of the device.

At 1004, the direct current signal is outputted via a second port of the device associated with the direct current circuit that comprises the bandstop circuit. For example, the second port can be a DC port.

At 1006, the microwave signal is outputted via a third port of the device associated with the microwave circuit. For example, the third port can be a microwave port.

For simplicity of explanation, the methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the methodologies in accordance with the disclosed subject matter. In addition, those skilled in the art will understand and appreciate that the methodologies could alternatively be represented as a series of interrelated states via a state diagram or events.

Moreover, because at least combining a direct current signal and a microwave signal and/or separating a direct current signal and a microwave signal are established from a combination of electrical and mechanical components and circuitry, a human is unable to replicate or perform processing performed by systems and/or devices disclosed herein. For example, a human is unable to combine a direct current signal and a microwave signal and/or separate a direct current signal and a microwave signal.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device, comprising:
   a direct current circuit that comprises a bandstop circuit and provides transmission of a direct current signal; and
   a microwave circuit that provides transmission of one or more microwave signals, wherein the microwave circuit and the direct current circuit that comprises the bandstop circuit are joined by a common circuit that provides transmission of the direct current signal and the microwave signal.

2. The device of claim 1, wherein the bandstop circuit of the direct current circuit blocks transmission of selected ones of the one or more microwave signals that are within a bandwidth of the device.

3. The device of claim 1, wherein the bandstop circuit of the direct current circuit comprises a set of quarter-wavelength transmission lines.

4. The device of claim 1, wherein the microwave circuit comprises a bandpass circuit.

5. The device of claim 4, wherein the bandpass circuit of the microwave circuit allows transmission of selected ones of the one or more microwave signals that are within a bandwidth of the device.

6. The device of claim 4, wherein the bandpass circuit of the microwave circuit comprises a set of quarter-wavelength transmission lines.

7. The device of claim 1, wherein the common circuit combines the direct current signal received via a first port of the device and the one or more microwave signals received via a second port of the device to generate a combined signal that is output via a third port of the device.

8. The device of claim 1, wherein the common circuit separates a combined signal that is received via a first port of the device into the direct current signal via a second port of the device and the one or more microwave signals via a third port of the device.

9. The device of claim 1, wherein the device is a superconducting device.

10. A device, comprising:
    a direct current circuit that provides transmission of a direct current signal; and
    a microwave circuit that comprises a bandpass circuit and provides transmission of one or more microwave signals, wherein the microwave circuit that comprises the bandpass circuit and the direct current circuit are joined by a common circuit that provides transmission of the direct current signal and the one or more microwave signals.

11. The device of claim 10, wherein the bandpass circuit of the microwave circuit allows transmission of selected ones of the one or more microwave signals within a bandwidth of the device.

12. The device of claim 10, wherein the bandpass circuit of the microwave circuit comprises a set of lumped circuit elements.

13. The device of claim 10, wherein the bandpass circuit of the microwave circuit comprises a set of inductors and a set of capacitors.

14. The device of claim 10, wherein the direct current circuit comprises a bandstop circuit.

15. The device of claim 14, wherein the bandstop circuit of the direct current circuit blocks transmission of selected ones of the one or more microwave signals within a bandwidth of the device.

16. The device of claim 14, wherein the bandstop circuit of the direct current circuit comprises a set of quarter-wavelength transmission lines.

17. A device, comprising:
    a direct current circuit that comprises a quarter-wavelength transmission line and a capacitor, wherein the direct current circuit provides transmission of a direct current signal; and
    a microwave circuit that provides transmission of a microwave signal, wherein the microwave circuit and the quarter-wavelength transmission line of the direct current circuit are joined by a common circuit that provides transmission of the direct current signal and the microwave signal.

18. The device of claim 17, wherein the capacitor is coupled between the quarter-wavelength transmission line and electrical ground.

19. The device of claim 17, wherein the capacitor is a first capacitor, and wherein the microwave circuit comprises a second capacitor electrically coupled to the quarter-wavelength transmission line and the common circuit.

20. A method, comprising:
   receiving a direct current signal via first port of a device associated with a direct current circuit that comprises a bandstop circuit;
   receiving a microwave signal via second port of the device associated with a microwave circuit that is joined to the direct current circuit by a common circuit that provides transmission of the direct current signal and one or more microwave signals; and
   combining the direct current signal received via the first port and the one or more microwave signals received via the second port to generate a combined signal that is output via a third port of the device.

21. The method of claim 20, further comprising blocking, via the bandstop circuit, transmission of selected ones of the one or more microwave signals within a bandwidth of the device.

22. The method of claim 20, further comprising allowing, via a bandpass circuit of the microwave circuit, transmission of selected ones of the one or more microwave signals within a bandwidth of the device.

23. A method, comprising:
   receiving a combined signal that comprises a direct current signal and one or more microwave signals via first port of a device associated with a common circuit that joins a microwave circuit and a direct current circuit that comprises a bandstop circuit;
   outputting the direct current signal via a second port of the device associated with the direct current circuit that comprises the bandstop circuit; and
   outputting the microwave signal via a third port of the device associated with the microwave circuit.

24. The method of claim 23, further comprising blocking, via the bandstop circuit, transmission of selected ones of the one or more microwave signals within a bandwidth of the device.

25. The method of claim 23, further comprising allowing, via a bandpass circuit of the microwave circuit, transmission of selected ones of the one or more microwave signals within a bandwidth of the device.

* * * * *